United States Patent [19]

Yanagawa

[11] Patent Number: 5,523,693
[45] Date of Patent: Jun. 4, 1996

[54] BALANCED SIGNAL SOURCE

[75] Inventor: Koichi Yanagawa, Kobe, Japan

[73] Assignee: Hewlett-Packard Company, Palo Alto, Calif.

[21] Appl. No.: 69,920

[22] Filed: Jun. 1, 1993

[30] Foreign Application Priority Data

May 30, 1992 [JP] Japan .................................. 4-163577

[51] Int. Cl.$^6$ ................................................. G01R 27/28
[52] U.S. Cl. ............................. 324/651; 333/149; 333/25
[58] Field of Search ............................ 324/651, 98, 126; 333/4, 25, 32; 330/149

[56] References Cited

U.S. PATENT DOCUMENTS

| | | | |
|---|---|---|---|
| 1,951,026 | 3/1934 | Levine | 333/4 |
| 2,131,101 | 9/1938 | Ferris | 178/44 |
| 2,223,736 | 12/1940 | Mertz | 333/32 |
| 2,264,718 | 12/1941 | Rust et al. | 333/25 |
| 2,301,023 | 1/1942 | Darlington | 333/32 |
| 2,658,959 | 11/1953 | Doherty | 333/25 |
| 2,909,663 | 10/1959 | McFarlane et al. | 333/32 |
| 3,344,283 | 9/1967 | Stubbs | 324/98 |
| 3,725,805 | 4/1973 | Orne | 330/149 |
| 4,207,518 | 6/1980 | Hopfer | 324/72.5 |
| 4,613,792 | 9/1986 | Kroessler | 333/32 |
| 4,707,672 | 11/1987 | Duret et al. | 333/4 |
| 4,717,896 | 1/1988 | Graham | 333/25 |
| 4,766,402 | 8/1988 | Crane | 333/25 |
| 4,800,344 | 1/1989 | Graham | 333/32 |
| 5,039,891 | 8/1991 | Wen et al. | 333/25 |

FOREIGN PATENT DOCUMENTS

| | | |
|---|---|---|
| 5651731 | 1/1991 | Japan . |
| 0920532 | 4/1982 | U.S.S.R. ............................. 324/651 |

OTHER PUBLICATIONS

Reference Data for Radio Engineers no month 1979 Baguley et al. pp. 20-11-20-13.

*Primary Examiner*—Maura K. Regan

[57] ABSTRACT

The bridge circuit receives the balance signal output from the balanced signal source, which generates a broad-band balanced signal over a frequency band of a direct current to several tens of MHz as a reflection-characteristic measuring bridge. The balance signal source is constructed by connecting in series the first balance output type circuit whose equivalent circuit is represented by the parallel-connection circuit of the resistor $R_1$ and the electrostatic capacitor C, and the second balance output type circuit whose equivalent circuit is represented by the parallel-connection circuit of the resistor $R_2$ and the inductance L, $R_1$, $R_2$, C and L of the first and second balanced output type circuits are set to such values that the output impedance of the balanced signal source is regarded as a pure resistance so that the balanced signal can be stably generated over the broad frequency band without suffering affection of the electrostatic capacitance of the first balanced output type circuit and the inductance of the second balanced output type circuit.

7 Claims, 3 Drawing Sheets

BALANCED SIGNAL SOURCE

TECHNICAL FIELD

This invention relates to a balanced signal source for measuring reflection-characteristics over a wide frequency band ranging from a direct-current area to a high-frequency area, which is suitably used as a signal source for a bridge.

BACKGROUND ART

A bridge has been provided as an apparatus for measuring reflection characteristics of a device under test (DUT).

FIG. 6 is a circuit diagram of a conventional bridge for measuring of reflection-characteristics. In FIG. 6, the bridge comprises a bridge circuit 4 and a balanced signal source 5, and is designed as follows.

In the bridge circuit 4, a series circuit of resistors Rb and Rc (the connection point between Rb and Rc is represented by p) and a series circuit of resistor Ra and DUT (the connection point between Ra and DUT is represented by q) are connected in parallel, and a measurement instrument 6 (internal resistance $R_o$) is connected between p and q of the parallel-connection circuit. The connection point q is connected to the ground (GND). The connection point n between DUT and Rc and the connection point m between Rb and Ra are supplied with a balanced signal from a balanced signal source 5.

The balanced signal source 5 comprises a signal source $V_1$ having an internal resistance $R_1$ and a transformer, $T_1$. An unbalanced signal from the signal source $V_1$ is applied to a primary winding of the balance/unbalance converting transformer $T_1$ whose one terminal is connected to the ground, and a balanced signal is taken out of a secondary winding.

The balanced signal source 5 has typically used a circuit using the transformer $T_1$ as shown in FIG. 6 in which primary and secondary windings are separated and one terminal of the primary winding is grounded, a circuit using a transmission-line type of transformer $T_2$ as shown in FIG. 7, or a circuit using the combination of the above circuits. Particularly in a reflection-characteristics measuring bridge which is used in combination with a network analyzer, such as, 87511A Network Analyzer manufactured and sold by Hewlett-Packard Company, the circuit using the transformer $T_2$ as shown in FIG. 7 has been frequently used in consideration of its high-frequency characteristic.

When the balanced signal source uses the transformer $T_1$ as described above, an frequency band has a lower limit at a frequency band and cannot be used with a DC current. If its characteristic is lower than several tens Hz, the transformer $T_1$ must be disadvantageously large in size and heavy in weight.

Further, it is natural that a low-frequency transformer has a deteriorated frequency characteristic, and its frequency bandwidth is usually about four digits. Therefore, conventionally, a special consideration must be paid in order to broadening an bandwidth over the limited bandwidth.

For example, when a reflection wave is measured over a frequency band of about 100 Hz to 10 MHz, the frequency band is divided into plural narrow bands, and a reflection-characteristic measuring bridge with a transformer having the optimum frequency characteristic for each band is individually provided. For measurement of a reflection characteristic of a DUT, a reflection-characteristic measuring bridge which is most suitable for the frequency band is selectively used in accordance with the frequency band.

Therefore, for measurement over a broad frequency band, plural reflection-characteristic measuring bridges are required, and thus not only the number of parts is disadvantageously increased, but also a device is required to be designed in large size.

In a broadcasting station and a recording studio, a balanced output type amplifying circuit 21 as shown in FIG. 8 is used to depress an induced noise to a cable (see Japanese Laid-open Utility Model Application No. 57-166412).

The amplifying circuit 21 as described above converts a signal from a signal source in an unbalanced system (not shown) to a balanced signal.

That is, the unbalanced signal is input from an input terminal Pi to a buffer amplifying circuit 22. The buffer amplifying circuit 22 supplies its output signal to an amplifying circuit 24 and at the same time supplies its output signal through an inverting amplifying circuit 23 to an amplifying circuit 25.

The amplifying circuit 22 comprises an operational amplifying circuit OPa, and the amplifying circuit 23 comprises an operational amplifier OPb and resistors $r_{31}$ and $r_{32}$. The amplifying circuit 24, 25 comprises an operational amplifying circuit OPc and resistors $r_{41}$, $r_{42}$, $r_{43}$, $r_{44}$ and $r_{45}$, or an operational amplifying circuit OPd and resistors $r_{51}$, $r_{52}$, $r_{53}$, $r_{54}$ and $r_{55}$.

The amplifying circuit 25 is subjected to a feedback range from the output of the amplifying circuit 24 through the resistor $r_{55}$, and the amplifying circuit 24 is subjected to the feedback from the output of the amplifying circuit 25 through the resistor $r_{45}$. A balanced output signal is output from the output terminal Pa of the amplifying circuit 24 and the output terminal Pb of the amplifying circuit 25.

The balanced output type amplifying circuit 21 is usable in place of the balanced signal source 5 as described with reference to FIG. 6, and the measurement for a frequency range includes a direct-current area.

However, such an amplifier aims to cover a voice band, and thus the upper limit frequency thereof ranges from several tens kHz to several hundreds kHz. Therefore, this amplifier has a disadvantage that the frequency band can not be broadened.

OBJECTS OF THE INVENTION

This invention is proposed to solve the above problems, and has an object to provide a balanced signal source which is suitably used as a signal source for a reflection-characteristic measuring bridge and in which measurement can be performed over a broad band ranging from a direct current to several tens MHz using a single device.

SUMMARY OF THE INVENTION

In order to attain the above object, the balanced signal source according to this invention comprises a series-connected circuit in which the output terminal of a capacitive balanced output type circuit is connected to the output terminal of an inductive balanced output type circuit in series, and a circuit constant of each circuit is selectively set to such a value that the output impedance of the series-connected circuit is regarded as a pure resistance.

Further, the balanced signal source according to this invention comprises a series-connected circuit in which the output terminal of a first balanced output type circuit whose

3 equivalent circuit is represented by a parallel-connected circuit of a resistor and a capacitor is connected in series to the output terminal of a second balanced output type circuit whose equivalent circuit is represented by a parallel-connected circuit of a resistor and an inductance, and the electrostatic capacitance, the inductance and the resistance are selectively set to such values that the output impedance of the series-connected circuit is a pure resistance.

At least one transmission-line type of transformer may be cascade-connected to the rear stage of the first balanced output type circuit.

The term "pure resistance" is not limited to only a resistance containing no inductance component and no electrostatic capacitance component, but a resistance containing slightly the inductance component and the electrostatic capacitance component may be regarded as "pure resistance" insofar as an effect of this invention is obtained.

DETAILED DESCRIPTION OF THE CURRENT INVENTION

The operation according to this invention will be described for a case where the balanced signal source thus constructed is used as a signal source for a reflection-characteristic measuring bridge.

Figure 1:
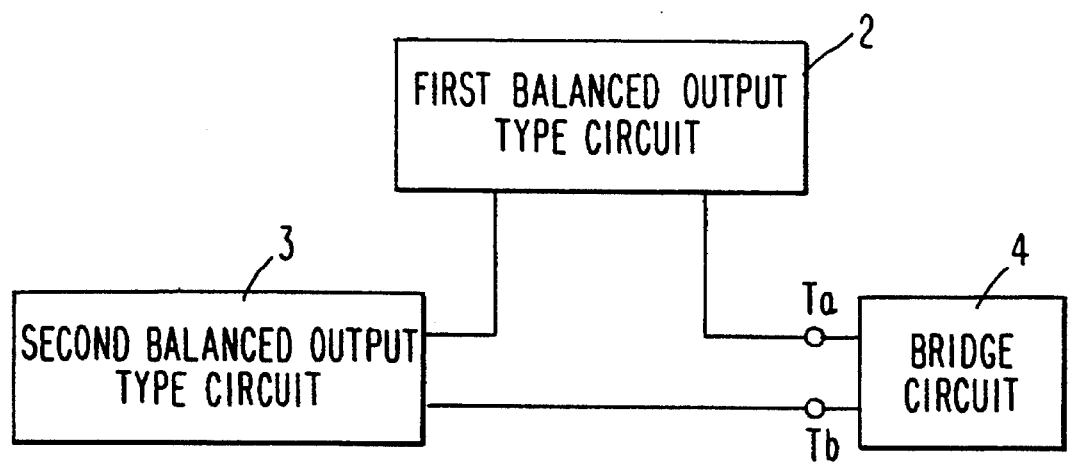
FIG. 1 is a circuit diagram showing the basic construction of this invention.
Figure 6:
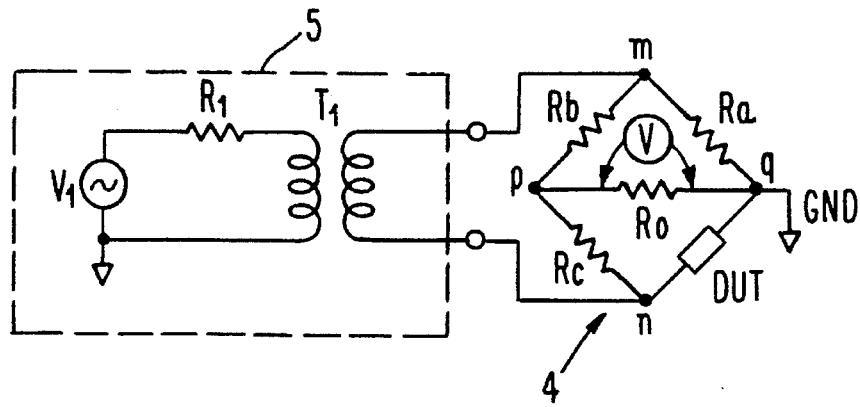
FIG. 6 is a circuit diagram of a conventional reflection-characteristic measuring bridge using a transformer as a balanced signal source.
Figure 7:
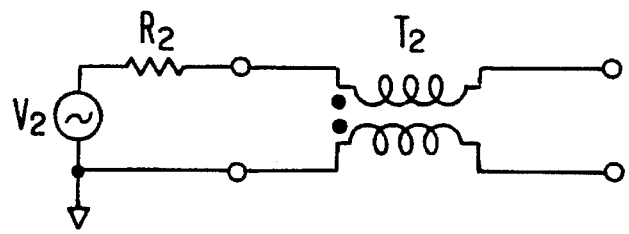
FIG. 7 shows a balanced signal source using a transmission-line type of transformer.

As shown in FIG. 1, a balanced signal source 1 is constructed in combination of a first balanced output type circuit 2 suitable for a low-frequency band and a second balanced output type circuit 3 suitable for a high frequency band, and output terminals Ta and Tb of the balanced signal source 1 are connected to a bridge circuit 4 (which is similar to the bridge circuit 4 as shown in FIG. 6).

Figure 2:
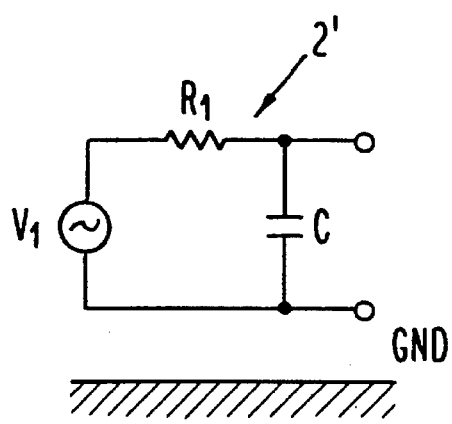
FIG. 2 is an equivalent circuit of the first balanced output type circuit of FIG. 1.
Figure 8:
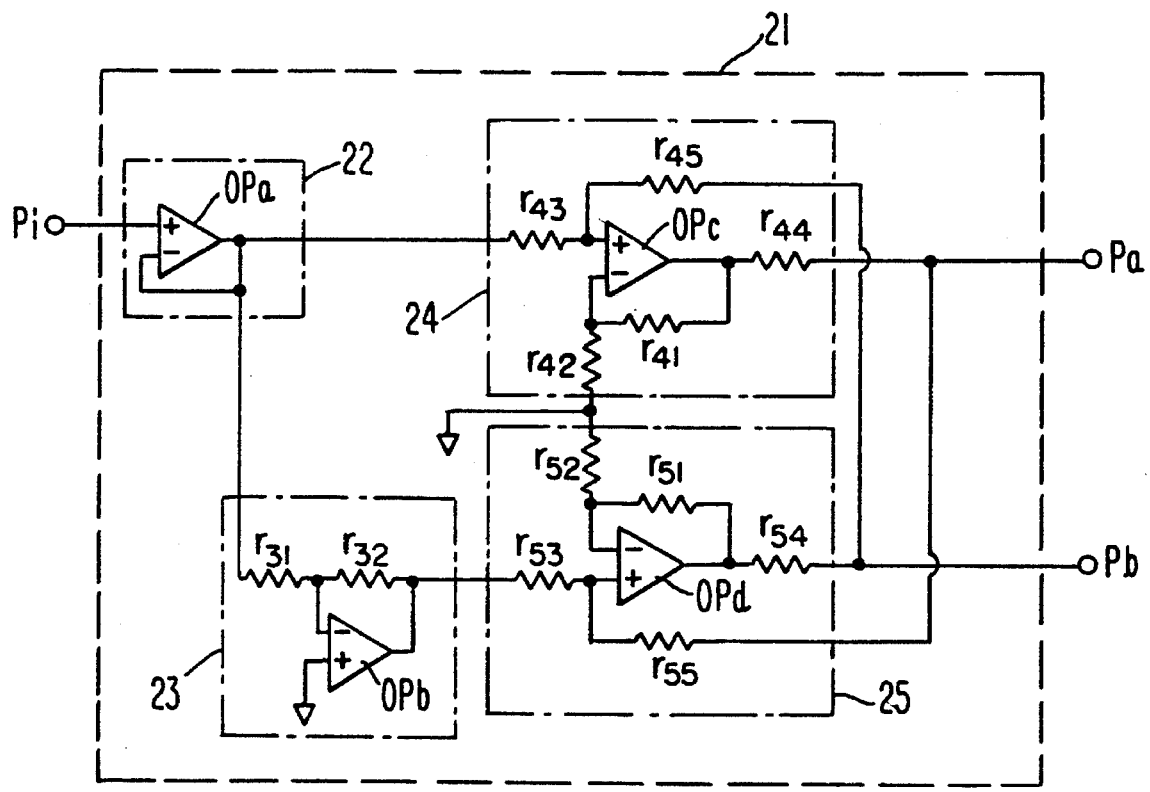
FIG. 8 is a circuit diagram showing an example of a conventional balanced signal source constructed by an electronic circuit.

The first balanced output type circuit 2 is constructed, for example by connecting a capacitor C between the output terminals of the balanced output type of amplifying circuit 21 as shown in FIG. 8, and the equivalent circuit thereof is represented by a circuit as shown in FIG. 2 which is wholly floated from GND.

4

In FIG. 2, the equivalent circuit comprises a series-connected circuit of a voltage signal source V1 and an internal resistance R1, and a capacitor C which is connected to the series-connected circuit in parallel, and a balanced signal is taken out from both ends of the capacitor C.

Figure 3:
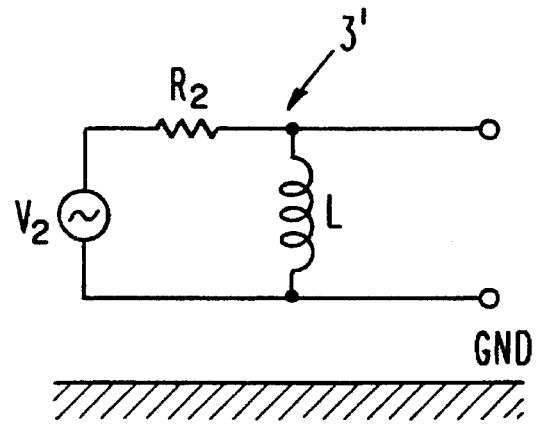
FIG. 3 is an equivalent circuit of the second balanced output type circuit of FIG. 1.
Figure 4:
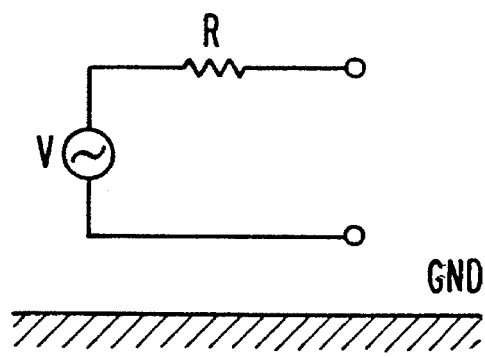
FIG. 4 is an equivalent circuit when the output terminals of the first balanced output type circuit and the second balanced output type circuit as shown in FIG. 1 are connected to each other in series.

The second balanced output type circuit 3 is similar to the conventional balanced signal source 5 comprising the transformer $T_1$ as shown in FIG. 6, for example, and the equivalent circuit thereof is represented by a circuit which is wholly floated from GND as shown in FIG. 3.

In FIG. 3, the equivalent circuit 3' comprises a series-connected circuit of a voltage signal source $V_2$ and an inductance L (an exciting inductance of the transformer $T_1$ for the balanced signal source 5 as shown in FIG. 6) which is connected to the series-connected circuit in parallel, and a balanced signal is taken out from both ends of the inductance L.

When the first and second balanced output type circuits 2 and 3 of the balanced signal source 1 as shown in FIG. 1 are represented by the equivalent circuits as shown in FIGS. 2 and 3, the output impedance $Z_0$ of the balanced signal source 1 (impedance seen from the output terminals Ta and Tb side) is calculated by the following equation.

$$Zo = \frac{R1 \frac{1}{j\omega C}}{R1 + \frac{1}{j\omega C}} + \frac{R2 \cdot j\omega L}{R2 + j\omega L} \quad \text{Equation 1}$$

$$= \frac{(R1 + R2)L + j\omega R1R2LC\left(1 - \frac{1}{\omega^2 LC}\right)}{R1R2C + L + j\omega R1LC\left(1 - \frac{R2}{\omega^2 LCR1}\right)}$$

Here, assuming that R1=R2=R, is Equation 1 represented as follows.

$$Zo = R \frac{2L/C + j\omega LR(1 - 1/\omega^2 LC)}{R^2 + L/C + j\omega LR(1 - 1/\omega^2 LC)} \quad \text{Equation 2}$$

In Equation 3, selecting each value of R, L and C so as to satisfy the relation of $R^2 = L/C$, $Zo = R$. Usually, R is specified by impedance of a transmission system, and L is specified by the characteristic of the transformer so that the above relation is satisfied by suitably adjusting the value of C. Further, a voltage output $V_o$ from the output terminals Ta and Tb of the balanced signal source as shown in FIG. 1 is calculated by the following equation.

$$Vo = \frac{\frac{1}{j\omega C}}{R1 + \frac{1}{j\omega C}} V1 + \frac{j\omega L}{R2 + j\omega L} V2 \quad \text{Equation 3}$$

$$= \frac{(R2 + j\omega L)V1 + j\omega L(1 + j\omega CR1)V2}{R2 - \omega^2 LCR1 + j\omega(L + CR1R2)}$$

Assuming that $R_1 = R_2 = R$ and $V_1 = V_2 = V$, Equation 3 is represented as follows.

$$Vo = \frac{R(1 - \omega^2 LC) + 2j\omega L}{R(1 - \omega^2 LC) + j\omega(L + CR^2)} \cdot V \quad \text{Equation 4}$$

In Equation 4, assimilar to Equation 2, selecting each value of R, L and C so as to satisfy the relation of $R^2 = L/C$, $V_o = V$.

Therefore, the balance signal source 1 as shown in FIG. 1 may be regarded as a series-connected circuit of a voltage signal source V and an internal resistance R which is constructed in combination of the first balanced output type circuit 2 suitable for a low-frequency band and the second balanced output type circuit 3 suitable for a high-frequency band.

This balanced signal source 1 can be regarded as a single circuit having a signal source V whose frequency band is broadened, and the balanced signal can be stably output over the wide frequency band from the low-frequency band to the high-frequency band.

As described above, when the reflection characteristic is measured using the balanced signal source 1 according to this invention, measurement of the reflection characteristic of a DUT can be performed with no alteration of a transformer, etc.

In the circuit of FIG. 1, when at least one transmission-line type of transformer is cascade-connected to the rear stage of the first balanced output type circuit 2 or to the rear stage of the second balanced output type circuit 3, in the high-frequency band, for example, deterioration of the impedance of the first balanced output type circuit 2 to the ground can be improved.

Even when each output impedance of the first balanced output type circuit and the second balanced output type circuit is not respectively represented by the parallel-connected circuit of the resistance and the electrostatic capacitance as shown in FIG. 2 or the parallel-connected circuit of the resistance and the inductance as shown in FIG. 3, the balanced signal source of this invention can be designed insofar as the output impedance of a circuit in which the output terminals are connected in series is represented as a pure resistance.

PREFERRED EMBODIMENT OF THE INVENTION

Figure 5:
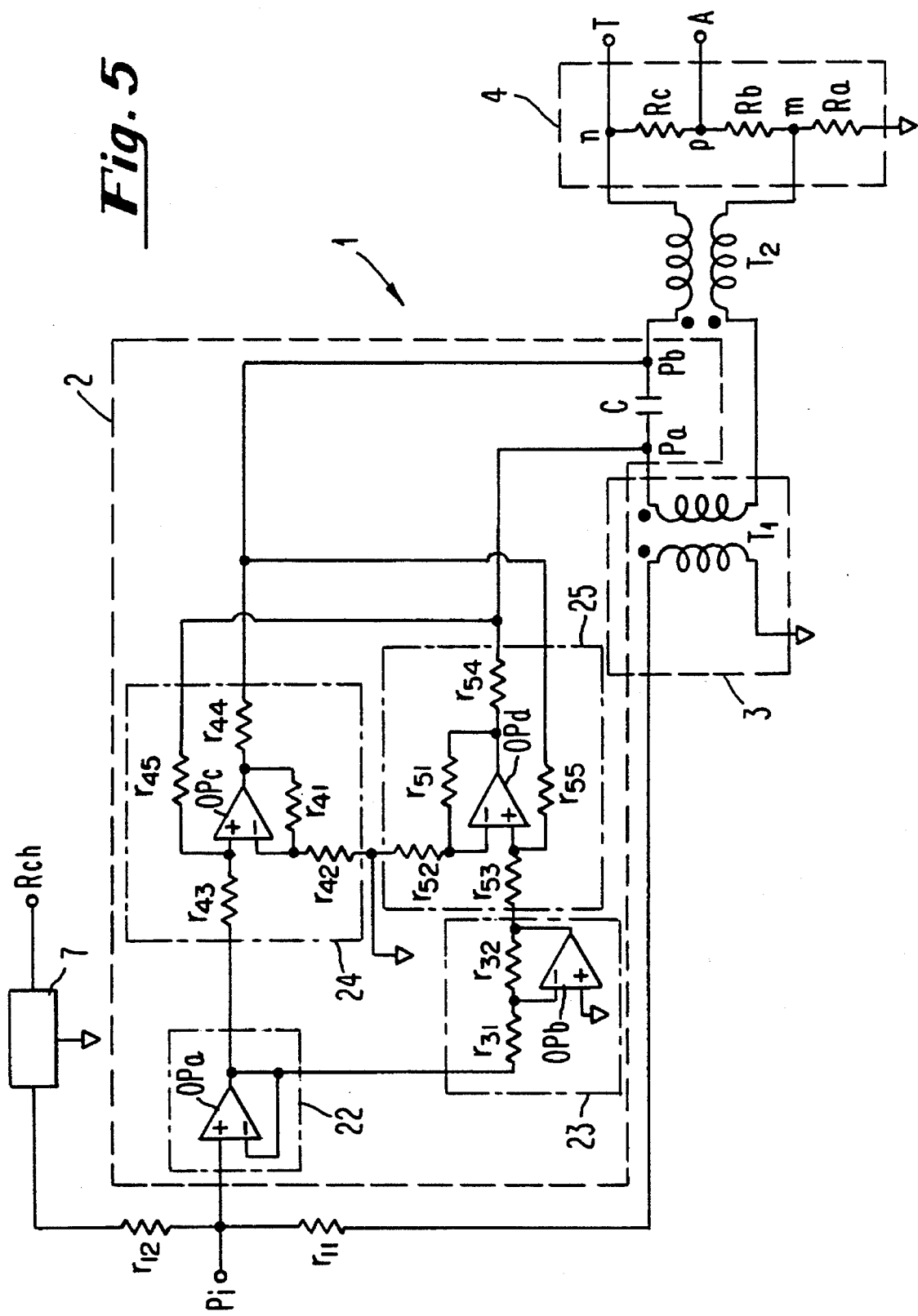
FIG. 5 is a circuit diagram of a preferred embodiment of this invention, and shows a reflection-characteristic measuring bridge using the balanced signal source as a signal source.

FIG. 5 is a circuit diagram of an embodiment of this invention, and shows a case where the balanced signal source 1 is used as a signal source for a reflection-characteristics measuring bridge.

The reflection-characteristics measuring bridge comprises a bridge circuit 4, a balanced signal source 1 and an attenuator 7.

The bridge circuit 4 is similar to the bridge circuit 4 as described with reference to FIG. 6, and only a part of the bridge circuit 4 (Ra to Rc, connection points m, n, p, etc.) is illustrated while the measuring instrument and the DUT are omitted from the FIG. 5. In this embodiment, a system impedance is set to 50Ω, and thus Ra to Rc are set to 50Ω.

The balanced signal source 1 comprises a first balanced output type circuit 2 suitable for measurement at a direct current and low-frequency band and a second balanced output type circuit 3 suitable for measurement at a high-frequency band.

The first balanced output type circuit 2 comprises a circuit having the same construction as the balanced output type of amplifying circuit 21 as shown in FIG. 8, and a capacitor C which is connected between the output terminals Pa and Pb of the circuit. An unbalanced signal from a signal source as not shown is supplied from an input terminal Pi to the first balanced output type circuit 2, and a balanced output signal is output from both ends Pa and Pb of the capacitor C. The basic operation of the amplifying circuit 21 was already described in the Background of the Invention the balanced output type circuit 2 was described with reference to FIG. 8, and thus it is omitted from the following description. In this embodiment, the values of resistors $r_{31}, r_{32}, r_{41}, r_{42}, r_{43}$ to $r_{45}, r_{51}, r_{52}, r_{53}$ and $r_{54}$ to $r_{55}$ for amplifiers 23, 24, 25 are set to 10 KΩ, while $r_{44}$ and $r_{54}$ are set to 50Ω.

The second balanced output type circuit 3 is constructed by a circuit similar to the circuit using the transformer as shown in FIG. 6, and the unbalanced signal as described above is applied to the primary winding of the transformer $T_1$ through the input terminal Pi and the resistor $r_{11}$ (50Ω), and the balanced signal is output from the secondary winding.

One end of the secondary winding of the transformer $T_1$ of the second balanced output type circuit 3 is connected to one end of the input side of the transmission-line type of transformer $T_2$ through the capacitor C, and the other end of the secondary winding of the transformer $T_1$ is connected to the other end of the input side of the transmission-line type of transformer $T_2$. With this transformer $T_2$, the high-frequency characteristics of the first balanced output type circuit 2 is improved.

One end of the output side of the transformer $T_2$ is connected to one end of the bridge circuit 4, and the balanced signal from the first and second balanced output type circuits 2 and 3 is supplied to the bridge circuit 4.

In FIG. 5, the input terminal Pi is connected to the attenuator 7 through the resistor $r_{12}$ (50Ω). The attenuator 7 serves to generate a comparison signal (represented by Rch) and the reflection characteristic of the DUT (connected between the terminal T and GND) is measured by the comparison signal and the output signal of the measuring instrument (connected between terminal A and GND).

In this embodiment, the system impedance is set to 50Ω, and thus by selecting the value of C so as to satisfy the relation of $(50Ω)^2 = L/C$ where the inductance seen from the output side of the transformer $T_1$ is represented by L, the balanced signal source 1 having excellent characteristics over the broad band can be realized.

Using the balanced signal source 1 as described above, a reflection characteristic measuring bridge having directivity above 25 dB at a frequency band of a direct current to 20 MHz for example can be obtained. Further, the frequency characteristic in a frequency band from the direct current to 20 MHz is +0.5/−2.5 dB in amplitude change.

Further, limiting the frequency band to the frequency band of the direct current to 5 MHz, a reflection-characteristic measuring bridge having directivity above 40 dB can be obtained.

In this embodiment, the balanced signal source 1 is usable over the frequency band of the direct current to 10 MHz. Therefore, a reflection characteristic measuring bridge capable of performing measurement substantially over a broad frequency band of the direct current to 10 MHz can be constructed using the balanced signal source 1.

In the above embodiment, it was described that the output of the first balanced output type circuit 2 can be operated from the direct current, however, this limitation is not necessarily required in accordance with its used mode. Further, in this embodiment, the first balanced output type circuit 2 is constructed by an electronic circuit including the operational amplifier, etc., however, it may be constructed by another means (low-frequency transformer, etc.).

In this embodiment, the transmission-line type of transformer $T_2$ is inserted into the output side of the balanced signal source 1. This is because the deterioration of the directivity at the high frequency can be improved. As described above, the impedance characteristic of the first balanced output type circuit 2 constructed by the electronic circuit to ground is deteriorated at a high frequency, and, therefore, if the first balanced output type circuit 2 has a sufficient characteristic in an used frequency band, the transformer $T_2$ is not necessarily required.

Further, in this embodiment, the transformer $T_2$ is inserted into the output side of the first and second balanced output type circuits 2 and 3, however, the transformer $T_2$ may be inserted between the first and second balanced output type circuits 2 and 3. In addition, two or more transformers may be cascade-connected to the rear side of the second balanced output type circuit 3, and the first balanced output type circuit 2 may be connected between any transformers of these cascade-connected transformers. In this case, these transformers must be designed in a transmission-line type which is similar to the transformer $T_2$ because a direct-current signal or a signal having a frequency near to the direct current is required to flow.

On the other hand, another transformer may be disposed in front of the transformer $T_1$ of the second balanced output type circuit 3. As a transformer to be disposed in front of the transformer $T_1$ may be used any one of a transformer having a primary winding whose one terminal is grounded, and a transmission-line type of transformer.

The connection of the first balanced output type circuit 2 to any one of the plus and minus sides of a signal path may be arbitrarily selected.

ADVANTAGES OF THE INVENTION

According to this invention as described above, the first signal source for a low-frequency band and the second signal source for a high-frequency band are connected in combination, and by utilizing the fact that the output impedance of the first balanced output type circuit is equivalently regarded as a capacitive in the vicinity of the upper-limit frequency, and the output impedance of the second balanced output type circuit is equivalently regarded as a capacitive in the vicinity of the lower-limit frequency, the output impedance thereof is so designed as to be given by only a resistive component.

With this construction, depression in measuring accuracy due to affection of the inductance of the transformer and the electrostatic capacitance of the electronic circuit is prevented.

Therefore, a compact reflection-characteristic measuring bridge capable of performing a measurement over a broad frequency band can be provided in low cost, and a signal source which is isolated from GND can be implemented with one circuit (balanced signal source).

What is claimed is:

1. A balanced signal source comprising:
   a capacitive balanced output circuit in response to a low-frequency portion of an unbalanced signal for outputting a balanced signal through a pair of first terminals, said capacitive balanced output circuit having a first output impedance of an equivalent circuit including at least an output resistor, an operational amplifier and a capacitor, said capacitor being connected across said first terminals, said operational amplifier and said output resistor being connected in parallel with said capacitor; and
   an inductive balanced output circuit serially connected to said first terminals of said capacitive balanced output circuit in response to a high-frequency portion of said unbalanced signal connected in parallel for outputting said balanced signal through a pair of second terminals, said inductive balanced output circuit having a second output impedance of another equivalent circuit including another resistor and an inductor connected in parallel and outputting a balanced output signal;
   a connection means for connecting said first terminal to said second terminal for outputting a balanced output signal across said first and second terminals;
   whereby a third output impedance of said balanced signal source is substantially a resistive component and said balanced output signal maintains its balance over a substantially wide range of frequencies.

2. The balanced signal source according to claim 1 wherein said inductor in said inductive balanced output circuit is a transformer.

3. The balanced signal source according to claim 1 further comprises a transmission-line type transformer connected to said capacitive balanced output circuit and said inductive balanced output circuit for preventing said balanced output signal from deteriorating.

4. The balance signal source according to claim 1 wherein a relationship among said resistor, said another resistor, said capacitor and said inductor is substantially characterized by $R^2 = L/C$, where L is said inductor, C is said capacitor and R is said resistor assuming that said resistor is substantially equal to said another resistor.

5. A reflection-characteristics measuring apparatus comprising:
   a capacitive balanced output circuit in response to a low-frequency portion of an unbalanced signal for outputting a balanced signal through a pair of first terminals, said capacitive balanced output circuit having a first output impedance of an equivalent circuit including at least an output resistor, an operational amplifier and a capacitor, said capacitor being connected across said first terminals, said operational amplifier and said output resistor being connected in parallel with said capacitor;
   an inductive balanced output circuit serially connected to said first terminals of said capacitive balanced output circuit in response to a high-frequency portion of said unbalanced signal connected in parallel for outputting said balanced signal through a pair of second terminals, said inductive balanced output circuit having a second output impedance of another equivalent circuit including another resistor and an inductor connected in parallel and outputting a balanced output signal;
   a transmission-line type transformer connected to said capacitive balanced output circuit and said inductive balanced output circuit for preventing said balanced output signal from deteriorating; and
   a bridge circuit connected to said transmission-line type transformer;
   whereby a third output impedance of said balanced signal source is substantially a resistive component and said balanced output signal maintains its balance over a substantially wide range of frequencies.

6. The balanced signal source according to claim 5 wherein said inductor in said inductive balanced output circuit is a transformer.

7. The balanced signal source according to claim 5 wherein the relationship among said resistor, said another resistor, said capacitor and said inductor is substantially characterized by $R^2 = L/C$, where L is said inductor, C is said capacitor and R is said resistor assuming that said resistor is substantially equal to said another resistor.

* * * * *